United States Patent
Saito

(10) Patent No.: US 7,973,588 B2
(45) Date of Patent: Jul. 5, 2011

(54) ANALOG INSULATION/MULTIPLEXER

(75) Inventor: Seiichi Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 411 days.

(21) Appl. No.: 12/298,673

(22) PCT Filed: Apr. 10, 2007

(86) PCT No.: PCT/JP2007/057876
§ 371 (c)(1),
(2), (4) Date: Oct. 27, 2008

(87) PCT Pub. No.: WO2007/138791
PCT Pub. Date: Dec. 6, 2007

(65) Prior Publication Data
US 2009/0066401 A1      Mar. 12, 2009

(30) Foreign Application Priority Data

May 26, 2006   (JP) ................. 2006-146599

(51) Int. Cl.
*H03K 17/00* (2006.01)
(52) U.S. Cl. ........................ 327/407; 327/408
(58) Field of Classification Search ................. 327/407, 327/408, 365
See application file for complete search history.

(56) References Cited

U.S. PATENT DOCUMENTS

| 3,805,094 A | 4/1974 | Orlando |
| 4,158,810 A * | 6/1979 | Leskovar ................. 324/127 |
| 4,629,971 A | 12/1986 | Kirk |

FOREIGN PATENT DOCUMENTS

| JP | 50-143454 | 11/1975 |
| JP | 5 232350 | 3/1977 |
| JP | 53 52347 | 5/1978 |
| JP | 6 262619 | 3/1987 |
| JP | 63 158911 | 7/1988 |
| JP | 5 176324 | 7/1993 |
| JP | 9 261951 | 10/1997 |

* cited by examiner

*Primary Examiner* — Shawn Riley
(74) *Attorney, Agent, or Firm* — Oblon, Spivak, McClelland, Maier & Neustadt, L.L.P.

(57) ABSTRACT

An analog insulation multiplexer not causing magnetic saturation even if a small transformer is used and having a wide use temperature range. The analog insulation multiplexer includes: a first switching element for generating a drive control signal in accordance with an external signal; a drive insulation transformer for receiving the drive control signal on a primary side via a first resistor and for delivering an insulated drive control signal from a secondary side; a second switching element for chopping an analog signal input in accordance with the insulated drive control signal; and an analog signal insulation transformer for delivering an insulated chopped analog signal on a secondary side. The analog insulation multiplexer further includes a secondary side output adjusting circuit having a second resistor connected, on the primary side of the drive insulation transformer, in parallel to the first resistor and a capacitor having one end connected to a ground and another end connected in series to the second resistor.

7 Claims, 4 Drawing Sheets

ANALOG INSULATION/MULTIPLEXER

TECHNICAL FIELD

The present invention relates to an analog insulation multiplexer that is used for collecting analog signals with eliminating influences of a ground of a signal source.

BACKGROUND ART

Conventionally, an analog signal collecting device is used, which utilizes an analog insulation multiplexer that insulates respective analog signal points from a ground for eliminating influences of the ground of a signal source and for collecting analog signals at low cost.

FIG. 6 is a structural diagram of an analog signal collecting device equipped with a conventional analog insulation multiplexer. Further, FIG. 7 is a circuit structural diagram of the conventional analog insulation multiplexer. In the analog insulation multiplexer shown in FIG. 7, it is necessary to apply an analog signal chopped by a FET switch FET2 (corresponding to second switching element) to a primary side of an analog signal insulation transformer T2 for inputting the analog signal insulated from the ground.

Therefore, in order to drive the FET switch FET2, a method is adopted in which a primary side of a drive insulation transformer T1 is controlled by another FET switch FET1 (corresponding to first switching element) concerning on and off of current (see Patent Document 1, for instance). Patent Document 1 describes various types of structures of the FET switch FET2 on the primary side of the analog signal insulation transformer T2, and it also describes that the drive insulation transformer T1 is driven by pulses.

In addition, as a circuit for driving the drive insulation transformer T1, a method is proposed in which a diode and a coil are combined so that drive time is decreased in accordance with data for reducing sag (see Patent Document 2, for instance).

Patent Document 1: JP 60-10449 B
Patent Document 2: JP 63-158911 A

DISCLOSURE OF THE INVENTION

Problems to be Solved by the Invention

However, the conventional technologies have the following problems. In the conventional analog insulation multiplexer, the drive insulation transformer drives a constant pulse voltage. Therefore, if the transformer is to be downsized, sag may increase. Otherwise, the transformer may cause magnetic saturation at high temperature, and hence analog data cannot be collected normally in some cases.

FIG. 8 is a diagram showing a temporal waveform of a voltage V2 on a secondary side of the drive insulation transformer T1 in the conventional analog insulation multiplexer. Since the transformer is downsized, it has a sufficient voltage exceeding a threshold voltage Vth of the FET switch FET2 at the start of the driving. On the latter half of the drive, however, the sag causes a decrease in voltage so that the voltage cannot exceed the Vth, and the FET switch FET2 cannot be turned on.

In addition, the method for shortening the drive time, such as control of the drive time in accordance with data is difficult to apply because it is performed at constant intervals of the drive pulse in the analog multiplexer in many cases. If the drive time is shortened, a pulse width of an analog signal delivered from the multiplexer becomes narrower. Therefore, it will cause a problem that a response time of a connected amplifier will be insufficient, resulting in insufficient settling, or that a sample hold unit on the subsequent stage cannot respond.

The present invention has been made to solve the problems described above, and therefore an object thereof is to obtain an analog insulation multiplexer having a wide use temperature range without magnetic saturation even if a small or a micro transformer is used.

Means for Solving the Problems

An analog insulation multiplexer according to the present invention includes: a first switching element for generating a drive control signal by switching in accordance with an external signal; a drive insulation transformer for receiving the drive control signal on a primary side via a first resistor and for delivering an insulated drive control signal from a secondary side; a second switching element for chopping an analog signal input in accordance with the insulated drive control signal so as to generate a chopped analog signal; and an analog signal insulation transformer for receiving the chopped analog signal on a primary side and for delivering an insulated chopped analog signal on a secondary side, in which the analog insulation multiplexer further includes a secondary side output adjusting circuit including a second resistor having an end connected between the primary side of the drive insulation transformer and the first resistor, and a capacitor having an end connected to a ground and another end connected in series to the second resistor.

Effects of the Invention

According to the present invention, it is possible to obtain the analog insulation multiplexer that has a secondary side output adjusting circuit including a series circuit of a resistor and a capacitor. In the analog insulation multiplexer, by designing an element value of this secondary side output adjusting circuit to be a desired value, a voltage waveform on the secondary side of the drive insulation transformer can be made close to a desired shape. Even if a small or a micro transformer is used, magnetic saturation does not occur so that a wide use temperature range can be realized.

BEST MODE FOR CARRYING OUT THE INVENTION

Hereinafter, a preferred embodiment of an analog insulation multiplexer according to the present invention is described with reference to the attached drawings.

The analog insulation multiplexer of the present invention has a secondary side output adjusting circuit, and hence a sufficient period can be secured during which a secondary side voltage of a drive insulation transformer for chopping an analog signal input exceeds a threshold voltage in accordance with ON/OFF period of an external control signal, and back swing can be converged quickly.

Embodiment 1

Figure 1:
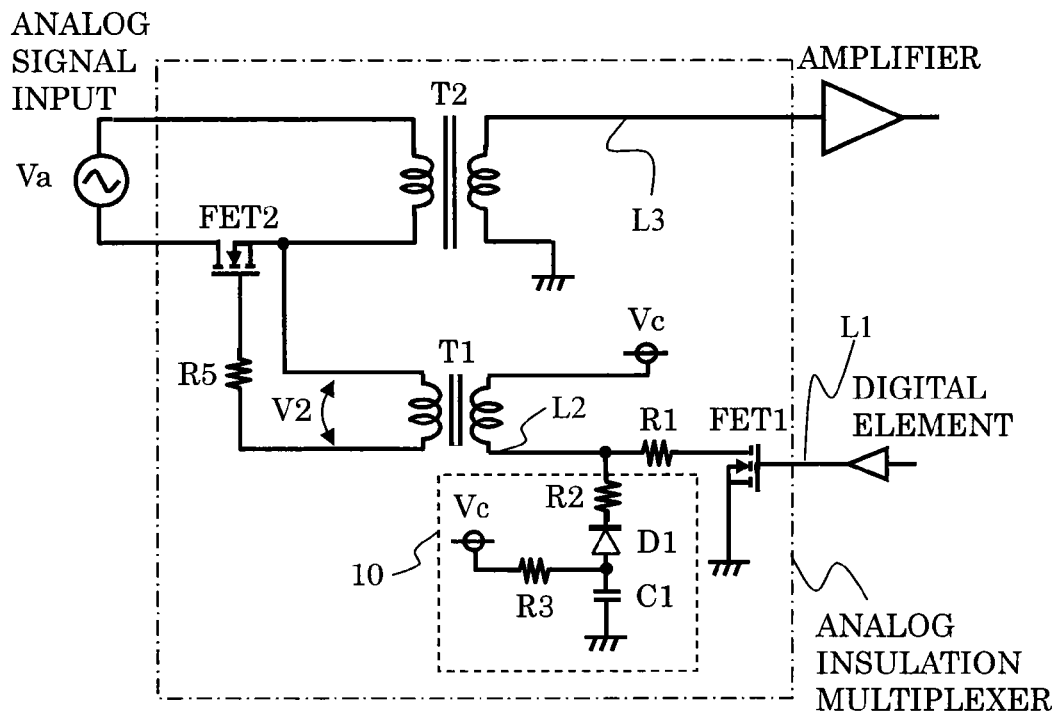
FIG. 1 is a structural diagram of an analog insulation multiplexer according to Embodiment 1 of the present invention.

FIG. 1 is a structural diagram of an analog insulation multiplexer according to Embodiment 1 of the present invention. The analog insulation multiplexer shown in FIG. 1 is made up of an drive insulation transformer T1, an analog signal insulation transformer T2, a field effect transistors FET1 and FET2, resistors R1 to R3, a diode D1, and a capacitor C1.

Here, the field effect transistor FET1 corresponds to a first switching element, and the field effect transistor FET2 corresponds to a second switching element. In addition, the resistors R1 to R3 correspond to first to third resistors, respectively. Although the field effect transistor is used as the switching element in the following description, it is possible to use other switching element such as a transistor.

Next, an operation of the analog insulation multiplexer according to Embodiment 1 is described. An external control signal delivered from a digital element is applied to a gate of the FET1 from a signal line L1. Then, the FET1 performs its switching operation in accordance with an ON/OFF period of the external control signal. As a result, a drive control signal is obtained on a signal line L2.

At the moment when the FET 1 is turned on, the capacitor C1 is charged at a power supply voltage Vc, and the capacitor C1 can be regarded as a battery of the voltage Vc within a sufficiently short period of time just after the FET 1 is turned on. In addition, a primary winding of the drive insulation transformer T1 has a large impedance in a transient state just after the FET1 is turned on, and hence little current flows. Therefore, a voltage $V_{L2}$ of the signal line L2 connected to the drive insulation transformer T1 just after the FET1 is turned on is derived from Equation (1) below.

$$V_{L2} = \frac{R1}{R1+R2}(V_C - V_{D1}) \quad (1)$$

Figure 2:
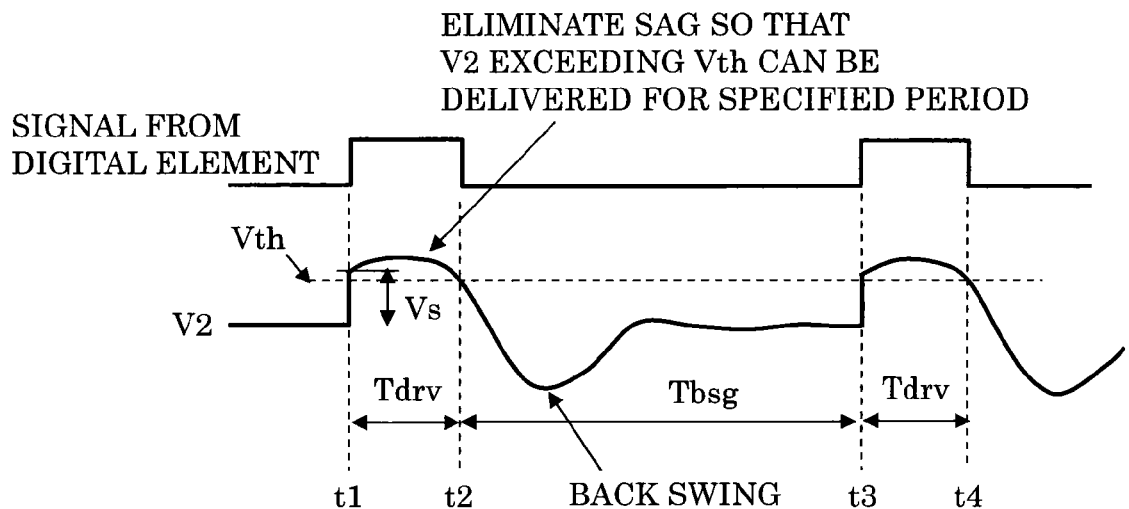
FIG. 2 is a diagram showing a temporal waveform of a secondary side voltage of a drive insulation transformer in Embodiment 1 of the present invention.

FIG. 2 is a diagram showing a temporal waveform of a secondary side voltage V2 of the drive insulation transformer T1 in Embodiment 1 of the present invention. As shown in FIG. 2, a voltage Vs equals $V_{L2}$ where Vs denotes a value of V2 at a time point t1 when the FET1 is turned on. By adjusting values of R1 and R2, a voltage exceeding the threshold voltage Vth of the FET2 can be set.

Next, as time passes after the FET 1 is turned on, discharge current flows from the capacitor C1 that is charged at Vc via the resistors R2 and the R1 so that the voltage of the signal line L2 increases gradually. A time constant τ of the discharge current is expressed by Equation (2) below, and the time constant can be changed by a capacitance of C1 and a resistance of (R1+R2).

$$\tau = (R1+R2) \times C1 \quad (2)$$

A voltage that is substantially the same as the voltage of the signal line L2 appears as a voltage on the secondary side of the drive insulation transformer T1 having a waveform shown in FIG. 2. In other words, if resistance values of the resistors R1 and R2 and a capacitance value of the capacitor C1 are designed appropriately based on above Equations (1) and (2), the influence of sag that is a problem in the conventional technology can be reduced and it is possible to maintain the voltage V2 to be Vth or higher over a sufficient period of time Tdrv corresponding to the ON period of the external control signal.

As a result, the FET2 is turned on for the period of time Tdrv, while an analog signal Va can be obtained as an output corresponding to amplitude of the analog signal Va on a signal line L3 on the secondary side via the analog signal insulation transformer T2.

When the FET1 is turned off in accordance with the external control signal (corresponding to the time point t2 in FIG. 2), the current flowing in the drive insulation transformer T1 on the primary side is interrupted. Therefore, a counter electromotive force is generated by an inductance of the drive insulation transformer T1.

This counter electromotive force makes the voltage of the signal line L2 rise from the voltage Vc, and hence a reverse bias is applied to the diode D1, which becomes turned off (this is equivalent to the state without the diode D1). Therefore, the capacitor C1 is disconnected from the signal line L2, which enables the back swing to be converged more quickly than the case where the capacitor C1 is connected.

According to Embodiment 1 described above, the secondary side output adjusting circuit is provided to the primary side of the drive insulation transformer. Therefore, the voltage waveform on the secondary side of the drive insulation transformer can be close to a desired shape corresponding to the external control signal. As a result, even if a small or micro transformer is used as the drive insulation transformer, it is possible to obtain the analog insulation multiplexer having a wide use temperature range without magnetic saturation.

Embodiment 2

Figure 3:
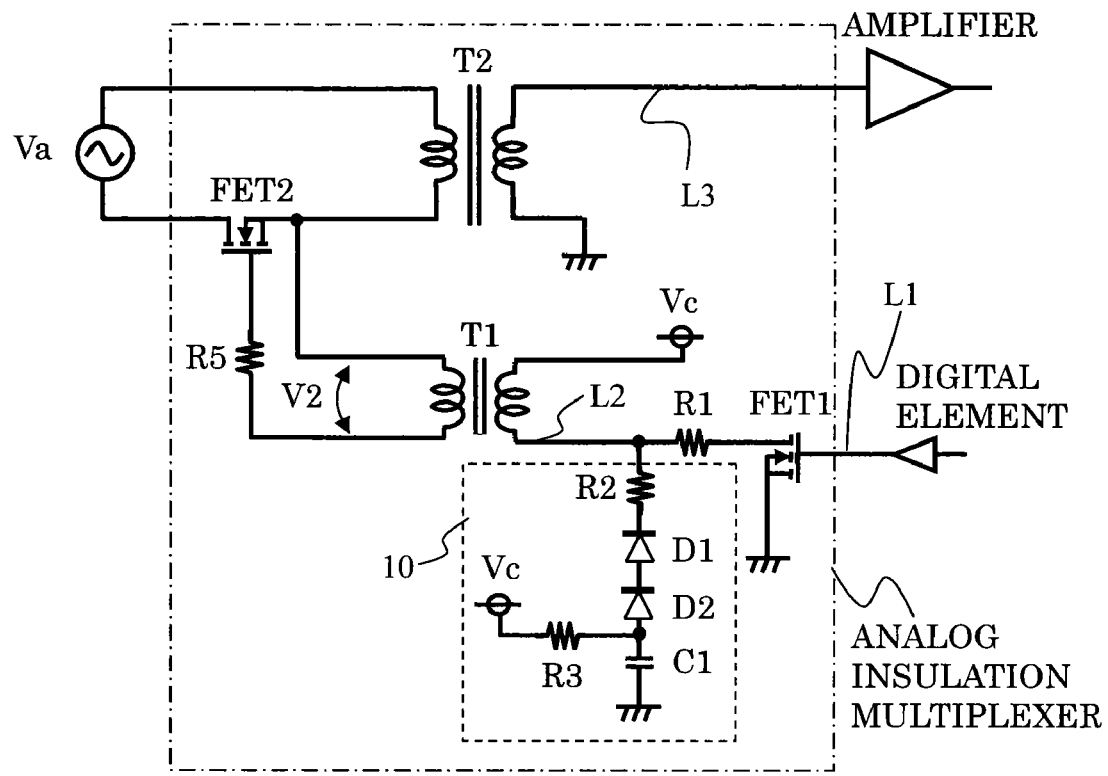
FIG. 3 is a structural diagram of an analog insulation multiplexer according to Embodiment 2 of the present invention.

FIG. 3 is a structural diagram of an analog insulation multiplexer according to Embodiment 2 of the present invention. A structure of Embodiment 2 shown in FIG. 3 is different from the structure of Embodiment 1 shown in FIG. 1 concerning the internal structure of the secondary side output adjusting circuit 10. More specifically, there are two diodes D1 and D2 in FIG. 3 while there is only one diode D1 in FIG. 1.

The basic operation is the same as that of Embodiment 1. More specifically, the capacitor C1 is charged up to the power supply voltage Vc at the moment when the FET 1 is turned on, and the capacitor C1 can be regarded as a battery of the voltage Vc within a sufficiently short period of time just after the FET1 is turned on in the same manner as in Embodiment 1.

Further, in Embodiment 2, the diodes D1 and D2 are connected in series. Therefore, if the D1 and D2 have the same voltage drop, $2V_{D1}$ becomes the reverse bias voltage. Then, just after the FET1 is turned on, the voltage $V_{L2}$ of the signal line L2 connected to the drive insulation transformer T1 is derived from Equation (3) below.

$$V_{L2} = \frac{R1}{R1+R2}(V_C - 2V_{D1}) \quad (3)$$

In other words, the voltage Vs can be set to a value exceeding the threshold voltage Vth of the FET2 by adjusting resistance values of the resistors R1 and R2 also in Embodiment 2. In particular, since the voltage $V_{L2}$ in the transient state in Embodiment 2 is lower than that in Embodiment 1 by $V_{D1}$, a resistance value of the resistor R2 can be small, whereby flexibility of the design can be obtained.

According to Embodiment 2 as described above, the series connection of the two or more diodes of the secondary side output adjusting circuit can also provide the same effect as the effect of Embodiment 1. In addition, flexibility of the design of the resistance values can be increased by increasing the number of diodes.

Embodiment 3

Figure 4:
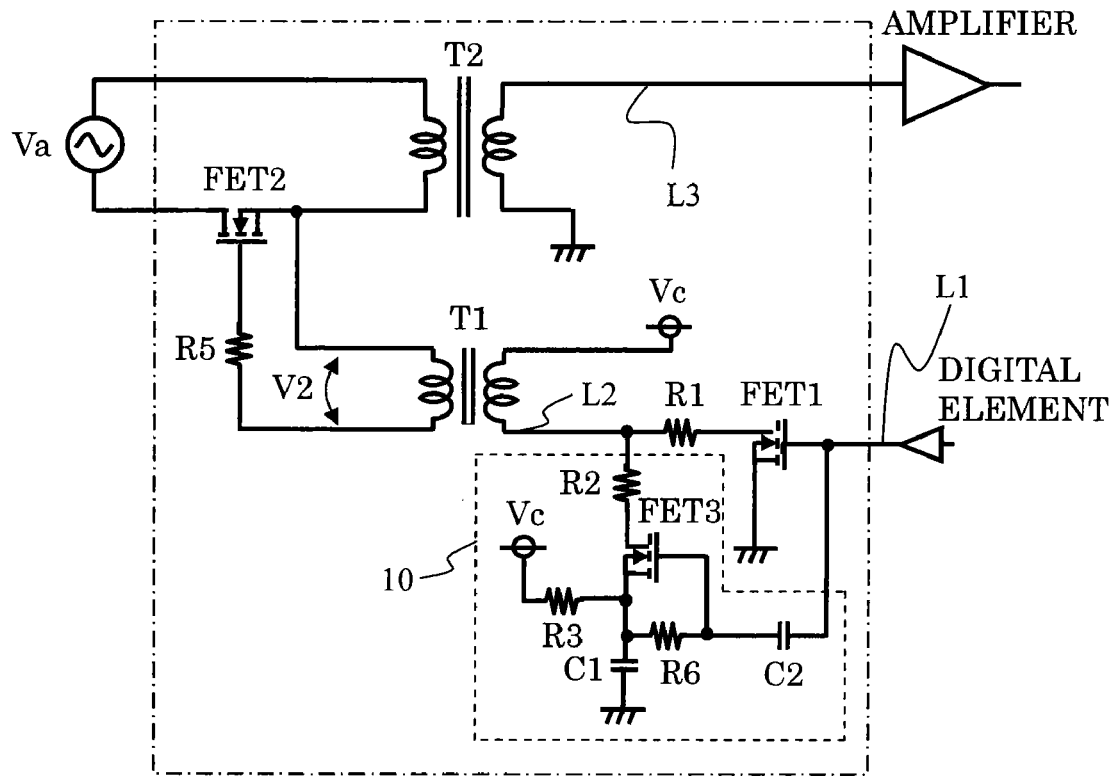
FIG. 4 is a structural diagram of an analog insulation multiplexer according to Embodiment 3 of the present invention.

FIG. 4 is a structural diagram of an analog insulation multiplexer according to Embodiment 3 of the present invention. A structure of Embodiment 3 shown in FIG. 4 is different from the structure of Embodiment 1 shown in FIG. 1 concerning the internal structure of the secondary side output adjusting circuit 10. More specifically, there are a FET3 corresponding to a third switching element, a resistor R6, and a capacitor C2 instead of the diode D1 shown in FIG. 1. The basic structure except for the secondary side output adjusting circuit 10 is the same as that shown in FIG. 1.

In FIG. 4, the external control signal delivered from a digital element is applied to gates of the FET 1 and the FET3 from the signal line L1. When the control signal is the H level, each of the FET1 and the FET3 is turned on. When the FET3 is turned on, the capacitor C1 is connected so that the time constant circuit having the capacitance of C1 and the resistance of (R1+R2) is formed in the same manner as in Embodiment 1.

More specifically, the capacitor C1 is charged up to the power supply voltage Vc at the moment when the FET 1 is turned on, and the capacitor C1 can be regarded as a battery of the voltage Vc within a sufficiently short period of time just after the FET1 is turned on.

In addition, the primary winding of the drive insulation transformer T1 has a large impedance in the transient state just after the FET1 is turned on, and hence little current flows. Therefore, the voltage $V_{L2}$ of the signal line L2 connected to the drive insulation transformer T1 just after the FET1 is turned on is derived from Equation (1) described above in Embodiment 1.

When the FET1 is turned off in accordance with the external control signal, the FET3 is also turned off simultaneously so that the capacitor C1 is disconnected from the signal line L2. As a result, the back swing can be converged quickly. The operation just after the FET1 is turned on and the operation after the FET1 is turned off are the same as those of Embodiment 1, and hence the waveform diagram of FIG. 2 can be applied as it is.

According to Embodiment 3 as described above, the third switching element is used instead of the diode in the secondary side output adjusting circuit, and hence the same effect can be obtained as Embodiment 1. In addition, since the diode is needless by using the third switching element, element values in the secondary side output adjusting circuit can be designed without considering a forward voltage drop of the diode.

Embodiment 4

Figure 5:
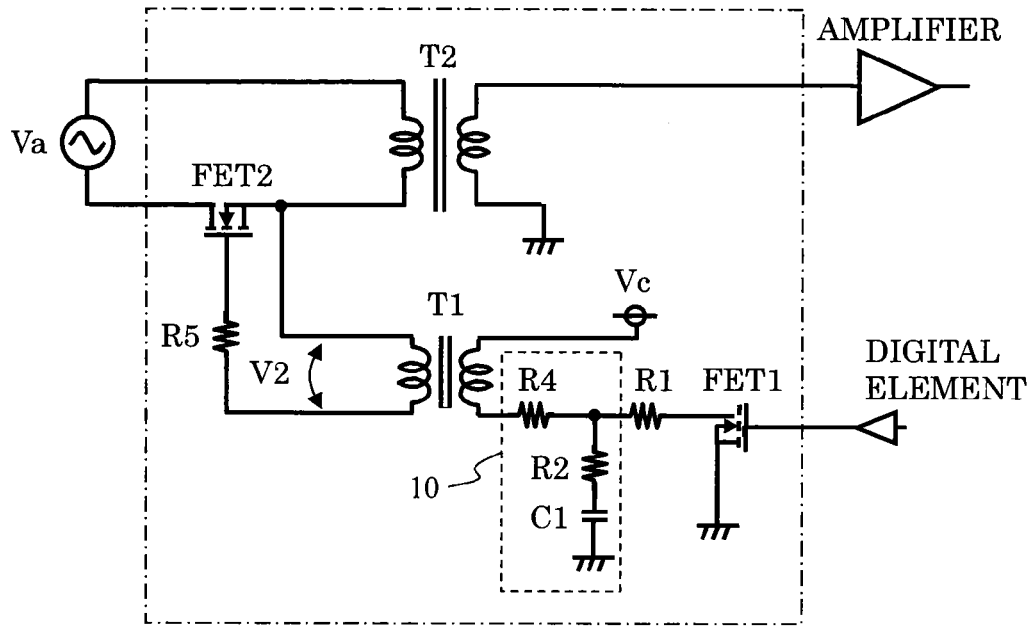
FIG. 5 is a structural diagram of an analog insulation multiplexer according to Embodiment 4 of the present invention.
Figure 6:
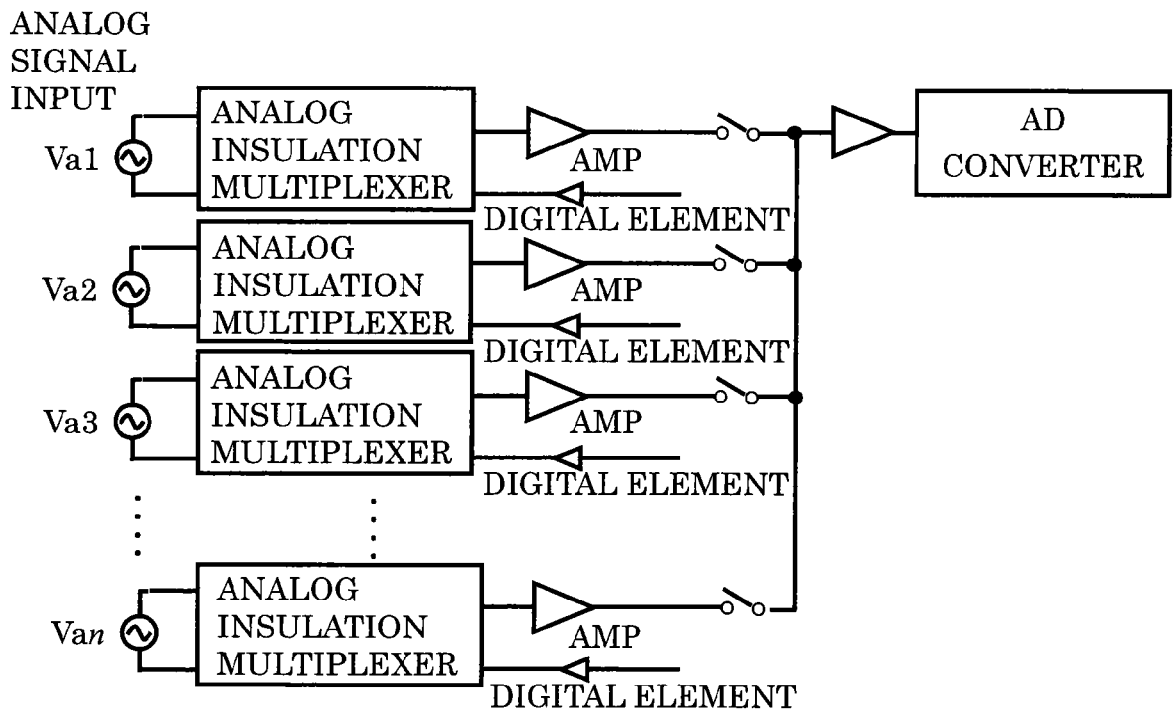
FIG. 6 is a structural diagram of an analog signal collecting device equipped with a conventional analog insulation multiplexer.
Figure 7:
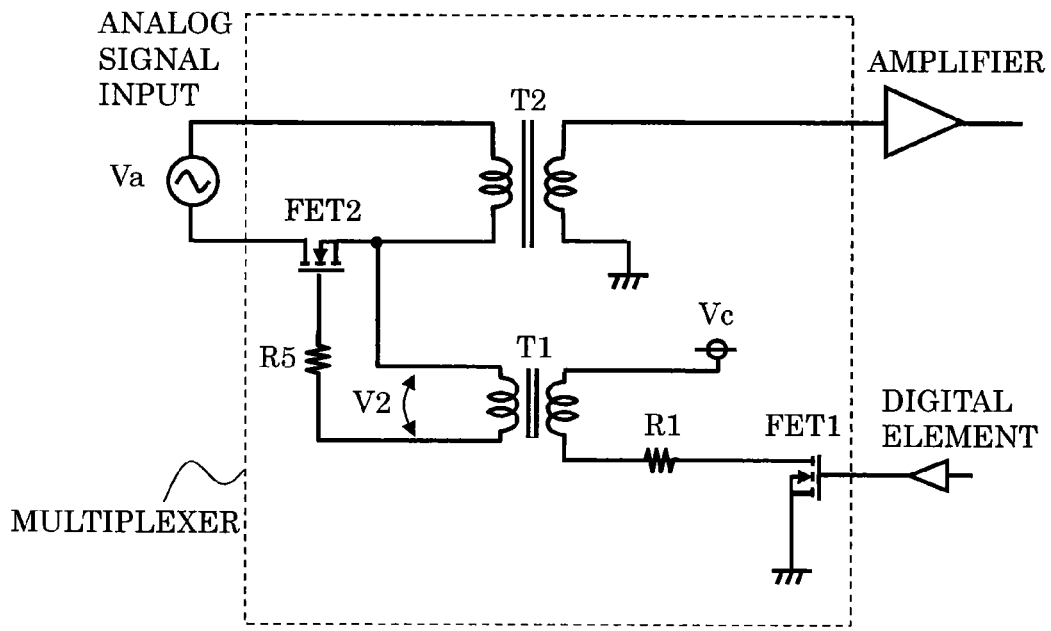
FIG. 7 is a circuit structural diagram of the conventional analog insulation multiplexer.
Figure 8:
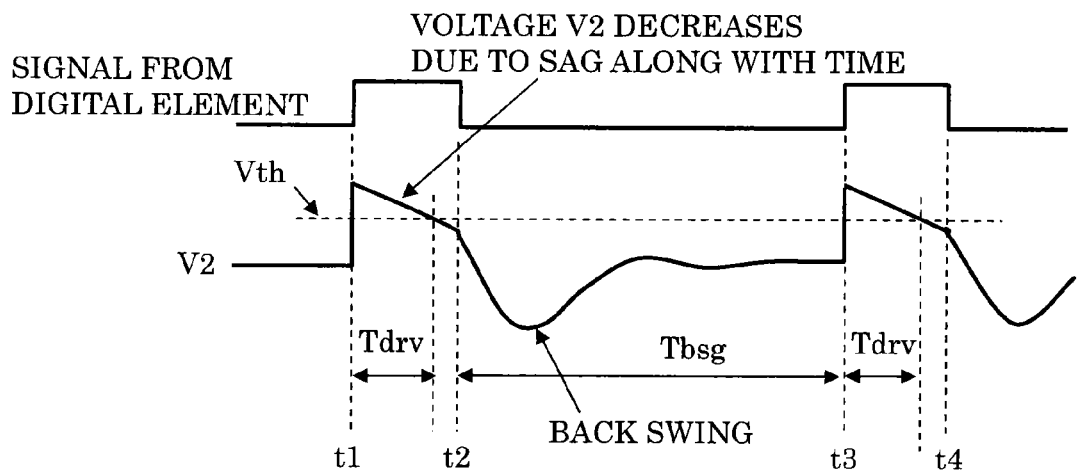
FIG. 8 is a diagram showing a temporal waveform of a secondary side voltage of a drive insulation transformer in the conventional analog insulation multiplexer.

FIG. 5 is a structural diagram of an analog insulation multiplexer according to Embodiment 4 of the present invention. A structure of Embodiment 4 shown in FIG. 5 is different from the structure of Embodiment 1 shown in FIG. 1 concerning the internal structure of the secondary side output adjusting circuit 10. More specifically, the diode D1 and the resistor R3 of FIG. 1 become needless. Instead, a resistor R4 corresponding to a fourth resistor is provided. The basic structure except for the secondary side output adjusting circuit 10 is the same as that shown in FIG. 1.

In FIG. 5, the external control signal delivered from the digital element is applied to the gate of the FET 1 from the signal line L1. If the control signal is the H level, the FET1 is turned on. When the FET1 is turned on, the capacitor C1 is connected so that the time constant circuit of the capacitance of C1 and the resistance of (R1+R2) is formed in the same manner as in Embodiment 1.

The operating waveform when the digital element is turned on is the same as that in FIG. 2. On the contrary, if the digital element is turned off, the capacitor C1 is connected to the primary winding of the transformer via the resistors R4 and R2.

In order to converge the back swing of the transformer quickly, it is better to disconnect the capacitor C1 when the digital element is turned off as shown in Embodiments 1 to 3. However, if there is a resistance value between the capacitor C1 and the primary winding of the transformer to some extent, it is also effective for settling the back swing.

Therefore, the secondary side output adjusting circuit 10 of Embodiment 4 has a structure shown in FIG. 5, in which a resistor R4 corresponding to a fourth resistor is further disposed on the primary side of the drive insulation transformer T1. More specifically, since the resistor R2 as well as the resistor R4 corresponding to the fourth resistor is disposed between the primary winding of the transformer and the capacitor C1, the back swing when the digital element is turned off can be suppressed.

As described above, according to Embodiment 4, the diode or the third switching element in the secondary side output adjusting circuit is eliminated, and instead, the fourth resistor is used for obtaining the same effect as in Embodiment 1 for the ON period of the external control signal. In addition, for the OFF period of the external control signal, the back swing can be suppressed by the simplified structure of the circuit although converging property of the back swing may be poorer compared with the case where the diode or the third switching element is used.

The invention claimed is:
1. An analog insulation multiplexer, comprising:
a first switching element for generating a drive control signal by switching in accordance with an external signal;
a drive insulation transformer for receiving the drive control signal on a primary side via a first resistor and for delivering an insulated drive control signal from a secondary side;
a second switching element for chopping an analog signal input in accordance with the insulated drive control signal so as to generate a chopped analog signal; and
an analog signal insulation transformer for receiving the chopped analog signal on a primary side and for delivering an insulated chopped analog signal on a secondary side,
wherein one side of a second resistor is connected to the first resistor in parallel on the primary side of the drive insulation transformer, a cathode side of a diode is connected to an opposite side of the second resistor, one side of a capacitor is connected to an anode side of the diode, and an opposite side of the capacitor is connected to a ground, and thereby a series circuit of the second resistor, the diode, and the capacitor is provided, and the one side of the capacitor is connected to a power supply via a third resistor for charging the capacitor, and thereby, when the first switching element is turned on, a drive voltage of the drive insulation transformer is made a constant voltage promptly, and after that, the drive voltage is increased at a predetermined time constant.

2. An analog insulation multiplexer according to claim 1, wherein the diode includes two or more diodes connected in series.

3. An analog insulation multiplexer according to claim 1, wherein instead of the diode inserted between the second resistor and the capacitor in series, a third switching element is inserted for switching similarly to the first switching element and that performs switching in accordance with the external signal.

4. An analog insulation multiplexer according to claim 1, wherein the switching element is a field effect transistor.

5. An analog insulation multiplexer according to claim 1, wherein the switching element is a transistor.

6. An analog insulation multiplexer according to claim 3, wherein the switching element is a field effect transistor.

7. An analog insulation multiplexer according to claim 3, wherein the switching element is a transistor.

* * * * *